United States Patent [19]
Hart et al.
[11] 3,911,269
[45] Oct. 7, 1975

[54] CIRCUIT ARRANGEMENT HAVING AT LEAST ONE CIRCUIT ELEMENT WHICH IS ENERGISED BY MEANS OF RADIATION AND SEMICONDUCTOR DEVICE SUITABLE FOR USE IN SUCH A CIRCUIT ARRANGEMENT

[75] Inventors: Cornelis Maria Hart; Arie Slob, both of Eindhoven, Netherlands

[73] Assignee: U.S. Philips Corporation, New York, N.Y.

[22] Filed: Nov. 25, 1974

[21] Appl. No.: 527,029

Related U.S. Application Data

[63] Continuation of Ser. No. 230,430, Feb. 29, 1972, abandoned.

[30] Foreign Application Priority Data

Mar. 20, 1971 Netherlands ............ 7103772
June 18, 1971 Netherlands ............ 7108373

[52] U.S. Cl. .......... 250/211 J; 250/206; 250/214 R; 307/311; 307/215; 330/16

[51] Int. Cl.² .......... H01J 39/12

[58] Field of Search .......... 250/211 J, 206, 214 R, 250/212; 307/278, 311, 214, 215, 317 A; 357/15, 19; 330/12, 36, 16, 26, 28

[56] References Cited

UNITED STATES PATENTS

| | | | |
|---|---|---|---|
| 3,280,333 | 10/1966 | Hyman et al. | 250/212 |
| 3,348,064 | 10/1967 | Powlus | 250/209 X |
| 3,500,073 | 3/1970 | Salaman | 250/206 X |
| 3,577,047 | 3/1971 | Cheroff | 250/211 X |
| 3,598,997 | 8/1971 | Baertsch | 357/15 |
| 3,617,823 | 11/1971 | Hofstein | 250/211 X |
| 3,660,667 | 5/1972 | Weimer | 250/209 |

*Primary Examiner*—Walter Stolwein
*Attorney, Agent, or Firm*—Frank R. Trifari; Leon Nigohosian

[57] ABSTRACT

The energizing of semiconductor circuit elements in integrated circuits by exposing p-n junctions to radiation which also form part of further semiconductor circuit elements, in which an irradiated junction serves not only as a supply element but also as a load of a circuit element to be supplied. Semiconductor structures having an efficient conversion of radiation into effective photo-current inter alia by using inverse transistors which are irradiated via the collector side of the transistor and in which the emitter-base photo-current is favoured relative to the collector-base photo-current.

24 Claims, 15 Drawing Figures

CIRCUIT ARRANGEMENT HAVING AT LEAST ONE CIRCUIT ELEMENT WHICH IS ENERGISED BY MEANS OF RADIATION AND SEMICONDUCTOR DEVICE SUITABLE FOR USE IN SUCH A CIRCUIT ARRANGEMENT

This is a continuation of application Ser. No. 230,430, filed Feb. 29, 1972, now abandoned.

The invention relates to a circuit arrangement having at least one circuit element which is energised by means of radiation and to a semiconductor device having a circuit element which is energized by means of radiation and is suitable for use in such a circuit arrangement.

A particular object of the invention is to avoid supply lines for the electric supply to be connected externally for energizing at least a part of such a circuit arrangement, so that the circuit arrangement becomes extremely suitable for being constructed as an integrated semiconductor device, in which a number of supply connection points of said semiconductor device may be omitted or even only connection points for electric input and output signals are necessary. A circuit arrangement according to the invention therefore, in general, is distinguished over known light-controlled transistor circuits, in which light signals control the conductivity of a transistor which is energized by an electric current source, in that, according to the invention, energy to obtain electric amplification is supplied by means of the incident light — or, in general, by the incident radiation.

The meaning of the expression "radiation" as used herein is not restricted to visible light but also comprises infrared and ultraviolet light, respectively, and in general that radiation for which the semiconductor material shows a conversion into electric energy.

The expressions energized and energizing are herein to be considered to mean supplied with or supplying with energy required for signal amplification, so the whole supply or the supply for the greater part of the main current through the relevant circuit element. In the case of a bipolar transistor said main current is formed by the emitter-collector current, in the case of a field effect transistor by the channel current between the source and drain electrodes, in a uni-junction or double-base transistor by the current from one base to the other, and so on. In addition, for operating such a circuit element a further bias current or bias voltage to be supplied to a control electrode is usually necessary, which bias current or bias voltage may also be supplied by means of the incident radiation. The radiation in the semiconductor devices to be described hereinafter may even serve exclusively to produce bias currents or voltages.

Known light-energized transistor circuits comprise a semiconductor element of which one or more p-n junctions are exposed to radiation so that such a junction behaves as an electric current source for energizing one or several further transistor(s) of the circuit.

According to a first aspect of the invention a circuit arrangement of the type described in the preamble is characterized in that the circuit arrangement comprises a first and a second transistor which are arranged in cascade and that the main current of the first transistor is supplied at least mainly by exposing the emitter-base junction of the second transistor to radiation. By choosing the emitter-base boundary layer of the second transistor for energizing the first transistor, circuit arrangements become possible which are extremely suitable for logic functions, for example, a NOR-gate, and for low-power and/or linear amplification, respectively, for example for hearing aids. The advantages mainly reside in considerable simplifications in the integration technology.

The preferred characteristic feature of the circuit arrangement according to said first aspect of the invention is that the emitters of the first and the second transistor are constructed as a base zone of one conductivity type in a semiconductor body, in which zone separated base zones of the opposite conductivity type are present within which the base-collector junctions of the first and the second transistor are located.

According to a second aspect of the invention, a circuit arrangement of the type mentioned in the preamble is characterized in that the circuit arrangement comprises a circuit element which is operated either in the on- or in the off-condition and serves as an electronic switch and that the supply current of the switch is supplied by a rectifying junction parallel to the main current path of the switch which rectifying junction is exposed to radiation said junction being consequently operated near either the shortcircuit current value or the zero current value of its current-voltage characteristic produced by the radiation in accordance with the fact whether the switch is in its on- or in its off-condition, the voltage thus produced across the rectifying junction being supplied for control purposes to a further circuit element serving as an electronic switch. In this case, the rectifying junction at the same time serves as a energizing source and as a load for the switch.

A circuit arrangement according to the second aspect of the invention is particularly suitable for use in digital circuits for logic circuits. Such logic circuits often comprise a large number of transistors which are integrated on a single semiconductor body and which are connected together by conductive tracks which form also a number of connection points for one or several inputs, for one or several outputs and for electric supply. By using the invention, conductive supply tracks for energizing circuit element are avoided, at least to a considerable degree.

Another object of the invention is to provide semiconductor devices which comprise a simple and efficacious transistor structure having a p-n junction to be biased by exposure to radiation, which devices can advantageously also be used in circuit arrangements according to the invention.

Another object of the invention is to provide a semiconductor structure in which the efficiency of conversion of radiation into a photo-current across an exposed junction is very favourable.

According to a third aspect of the invention, a semiconductor device suitable for use in a circuit arrangement according to a preceding aspect of the invention and comprising a semiconductor body having a transistor with an emitter zone, a base zone and a collector zone which are each provided with a connection contact, in which optic means are present to bias the emitter-base junction of the transistor at least temporarily in the forward direction by optic irradiation and a supply source to bias the collector zone in collecting condition, electric input signals are supplied to the transistor between the connection contacts of the base zone and the emitter zone and electric output signals are derived from the connection contact of the collector zone, is characterized in that the collector zone adjoins a main surface of the semiconductor body and, viewed on said main surface, the whole collector zone is situated on a part of the base zone, the base zone adjoining the main surface round about the collector zone, the base zone and the collector zone together adjoining the main surface only locally and the emitter zone extending below the whole base zone, in which the optic means are means to supply, via said main surface, optic radiation to the vicinity of the emitter-base junction of the transistor so that the photo-current generated by the optic means across the emitter-base junction in the case of an external shortcircuit across this emitter-base junction is larger than that across the collector-base junction in the case of an external shortcircuit across this collector-base junction.

The third aspect of the invention is inter alia based on the recognition of the fact that, although the use of an inverse transistor, that is to say a transistor the emitter-base junction of which lies deeper in the semiconductor body than the collector-bas junction, may give rise to a slightly smaller amplification factor, the use of an inverse transistor is nevertheless to be preferred from a point of view of radiation absorption. Moreover, for circuits as described above, the resulting amplification factor of the transistors generally is sufficient. Furthermore, the use of inverse transistors enables a particularly favourable integration form as will become apparent hereinafter.

So the invention is inter alia based on the recognition of the fact that the above-described inverse transistor structure may have certain advantages relative to a conventional planar silicon transistor the emitter zone of which is a highly doped surface zone which adjoins a surface of the semiconductor body and in which the emitter-base junction lies close below said one surface, optic radiation being supplied to the surroundings of the emitter-base junction via the one surface.

This is associated with the fact that, for example upon application of the conventional semiconductor materials such as germanium and silicon, mainly only blue light is absorbed in the thin emitter zone and in addition the resulting electron-hole pairs in the highly doped emitter zone recombine for the greater part before they can contribute to the photo-current across the emitter-base junction. The rapid recombination is due to the large impurity concentration in the emitter zone of a conventional planar transistor and said impurity concentration must be high since the emitter zone is usually obtained by diffusion in a surface part of a base zone already diffused. Green and red light penetrate deeper in the semiconductor body of the transistor, as a result of which this absorption also contributes only little to the photo-current across the emitter-base junction, while it is just red light that constitutes an important component of the radiation emitted by usual radiation sources, for example incandescent lamps.

In a semiconductor device according to the third aspect of the invention, the collector zone is constructed as a surface zone adjoining the main surface of the semiconductor body, while the emitter-base junction, viewed from main surface, lies deeper in the semiconductor body and below the base-collector junction, which has proved to be favourable for producing a photo-current and/or a photo-voltage across the emitter-base junction.

In manufacturing the semiconductor device according to the invention one is more free in choosing the doping of the emitter zone than in manufacturing a conventional planar transistor, since the emitter zone need not be provided as a diffused surface zone in a surface part of a diffused base zone. As a result of this, the doping of the emitter zone can be better adapted to requirements in connection with the generation of a photo-current and/or photo-voltage across the emitter-base junction.

The part of the base zone adjoining the main surface of the semiconductor body shows, preferably in a direction towards said main surfaces, an increasing impurity concentration, since a high impurity concentration in the main surface reduces the surface recombination of charge carriers in the base zone, as a result of which the amplification factor of the transistor improves. In this case, the impurity concentration in a direction towards the main surface may increase gradually, as in a diffused surface zone, or may increase more stepwise.

An important embodiment of the semiconductor device according to the third aspect of the invention having a simple structure which can easily be manufactured and which is very suitable for integration is characterized in that the semiconductor body comprises a semiconductor substrate having an epitaxial layer which is provided on said substrate and in which the base zone of the transistor is present, at least the part of the substrate adjoining the epitaxial layer belonging to the emitter zone.

The emitter zone in the semiconductor body preferably surrounds the base zone entirely, the emitter zone also adjoining the one surface. With the dimensions of the base zone remaining the same, this means an enlargement of the emitter-base junction to be exposed and hence of the photo-current to be obtained. In addition, the emitter zone may also be contacted, if desirable, at the one surface.

A further enlargement of the emitter-base junction and hence of the photo-current to be obtained can be achieved in that the emitter zone comprises a surface zone — termed emitter rim zone — which is situated beside the collector, zone, is separated by the base zone from the part of the emitter zone situated below the base zone and adjoins a part of the emitter zone adjoining the one surface and situated beside the base zone.

An important embodiment of the semiconductor device according to the third aspect of the invention which relative inter alia to integration of circuit arrangements according to the invention, in which transistors occur having inter-connected emitters, is characterized in that, in addition to the one transistor already mentioned, and semiconductor body comprises another transistor having a collector zone which adjoins the main surface of the semiconductor body, in which, viewed on the main surface, said collector zone is situated on a part of the base zone of the other transistor, said base zone adjoining the main surface round about the collector zone, and the emitter zone, which is common to the other and the already mentioned one transistor, extending below the whole base zone of both transistors. It will be obvious that more than two transistors having a common emitter zone may be incorporated in the semiconductor device and this will often be the case in practice.

The optic means are preferably means which also supply radiation to the surroundings of the emitter-base junction of the other transistor so as to bias said junction at least temporarily in the forward direction by optic radiation, in which a further improvement is characterized in that the collector zone of the one transistor is electrically connected to the base zone of the other transistor, electric input signals are supplied to the base zone of the one transistor and electric output signals are derived from the collector zone of the other transistor, Herewith an important part of a circuit arrangement according to the invention is obtained in an integrated form in a simple and efficacious manner.

The base zones of transistors having a common emitter zone of a semiconductor device according to the invention are preferably separated from each other in such manner that parasitic lateral transistors, the emitter zones and collector zones of which are constituted by the base zones of the transistors having a common emitter zone, have no or only a slightly disturbing effect. A preferred embodiment is therefore characterized in that a surface zone which belongs to the common emitter zone and which is more highly doped than the base zones is situated between the base zones of one and of the other transistors. By the highly doped zones between the base zones, the effect of the lateral transistors is suppressed at least for the greater part and furthermore the surface recombination becomes smaller.

Another preferred embodiment is characterized in that an insulating layer which is inset in the semiconductor body and extends from the main surface in the semiconductor body over a part of the thickness of said body is situated between the base zones of the one and of the other transistor. As a result of this, substantially no lateral transistor action can occur.

The invention furthermore provides a structure for the emitter zone of a transistor having an emitter-base junction to be biased by irradiation, said structure favourably influencing the obtaining of a photo-current across the emitter-base junction by absorption of radiation in the surroundings of said junction and nevertheless enabling a good amplification factor.

According to a fourth aspect of the invention, a semiconductor device which is suitable for use in a circuit arrangement according to the invention and comprises a semiconductor body having a transistor with an emitter zone, a base zone and a collector zone, in which optic means are present to bias the emitter-base junction of the transistor at least temporarily in the forward direction by optic irradiation and a supply source to bias the collector zone in the collecting condition, is characterized in that the emitter zone comprises two adjoining sub zones of one conductivity type of which one sub zone has a higher resistivity than the other sub zone and the one sub zone is situated between the base zone and the other sub zone and, the one sub zone forming with the base zone, which is of the opposite conductivity type, at least the greater part of the emitter-base junction.

The fourth aspect of the invention is inter alia based on the recognition of the fact that the emitter zone of a transistor of a semiconductor device, for example a semiconductor device which is suitable for use in a circuit arrangement according to the invention, in which the emitter-base junction is biased in the forward direction by optic radiation, must preferably show not only the high doping which is usual for an emitter zone.

It has been found that the one sub zone of higher resistivity of the emitter zone of a semiconductor device according to the fourth aspect of the invention improves the electro-optical effect of the emitter-base junction, that is to say the generation of a photocurrent across the emitter-base junction, while nevertheless a proper emitter efficiency occurs. In fact, for a reasonable emitter efficiency the thickness of the one sub zone having higher resistivity is preferably smaller than the diffusion length of the minority charge carriers in the one sub zone of higher resistivity. In view of the high quality of the semiconductor materials used nowadays, in which materials diffusion lengths of 100 $\mu$m and more occur, this means in practice hardly a restriction as regards the thickness of the one sub zone since in semiconductor technology zones of a semiconductor circuit element are usually constructed with a thickness considerably smaller then 100 $\mu$m. In practical embodiments of a semiconductor device according to the fourth aspect of the invention, the thickness of the one partial zone will often be chosen to be between 0.1 and 50 $\mu$m.

At most with the exception of edge parts of the emitter-base junction, said junction is preferably constituted by the one sub zone and the base zone.

An important embodiment of a semiconductor device according to the fourth aspect of the invention is characterized in that the collector zone adjoins a main surface of the semiconductor body and, viewed on said main surface, the whole collector zone is situated on a part of the base zone, the base zone adjoins the main surface round about the collector zone, the base zone is situated entirely on the one subzone of the emitter zone, said one subzone is situated on the other subzone of the emitter zone, and the one subzone, in directions parallel to the main surface, is bounded by a region which surrounds the base zone, extends from the main surface in the semiconductor body, is contiguous with the part of the other subzone situated below the one subzone, and constitutees with the one subzone a junction which impedes the penetration of minority charge carriers from the one subzone into the region.

In this embodiment the transistor surprisingly shows a particularly favourable amplification factor, which is thought to be based on the following: when the emitter-base junction is biased in the forward direction, charge carriers are also injected from the base zone into the emitter zone which are minority charge carriers there. For a good emitter efficiency, however, said injection should be as small as possible. The minority charge carriers injected into the one subzone of the emitter zone can penetrate into the more highly doped other subzone of the emitter zone with difficulty only, while in addition it is difficult for them to escape laterally due to the presence of the said region. As a result of this the injected minority charge carriers have a long stay in the one subzone adjoining the base zone as a result of which the injection from the base zone into the one subzone is restricted.

A favourable embodiment of a semiconductor device according to the fourth aspect of the invention, which is particularly suitable to be constructed as an integrated semiconductor device, is characterized in that the semiconductor body comprises a semiconductor substrate having an epitaxial layer which is provided thereon and which adjoins a main surface of the semiconductor body, in which epitaxial layer the base zone is present as a zone which adjoins the main surface round about the collector zone and which extends only over a part of the thickness of the epitaxial layer and which is situated below the whole collector zone adjoining the main surface, at least the part of the epitaxial layer situated below the base zone belonging to the one subzone of the emitter zone and at least the part of the substrate adjoining the epitaxial layer belonging to the other subzone of the emitter zone, the optic means being means to supply radiation to the surrounding of the emitter-base junction via the main surface.

In this case the region preferably extends throughout the thickness of the epitaxial layer, the region being of the same conductivity type as the emitter zone and being more highly doped than the base zone and belonging to the other subzone of the emitter zone.

The region may also advantageously consist of an insulating material, for example, silicon oxide, and extend throughout the thickness of the epitaxial layer.

With a view to an optimum amplification factor of the transistor, the one subzone preferably is not larger than is necessary, for which purpose a preferred embodiment of a semiconductor device according to the fourth aspect of the invention is characterized in that in directions parallel to the main surface the base zone is bounded by the region.

The invention furthermore provides a structure for a transistor having an emitter-base junction to be biased in the forward direction by optic radiation, in which the photo-current occurring across the collector-base junction, which photo-current is hardly avoidable in practice and is often undesirable, is small relative to the photo-current occurring across the emitter-base junction.

According to a fifth aspect of the invention, a semiconductor device, which is suitable for use in a circuit arrangement according to the invention, has a semiconductor body with a transistor having a collector zone present at one side of the semiconductor body, which collector zone constitutes a collector-base junction with the base zone of the transistor. The transistor has an emitter zone which, viewed on the said side of the semiconductor body, is situated at least below the collector zone and which constitutes the emitter-base junction with the base zone. The device comprises optic means to bias the emitter-base junction at least temporarily in the forward direction by optic irradiation and a supply source to bias the collector zone in the collecting condition. Viewed on the said one side of the semiconductor body, the collector-base junction has a considerably smaller lateral extent than the emitter-base junction, the photo-current generated by the optic means across the emitter-base junction in the case of an external shortcircuit across said junction being larger than that across the collector-base junction in the case of an external short-circuit across said junction.

The fifth aspect of the invention thus is inter alia based on the recognition of the fact that a photo-current, which is small relative to the photo-current across the emitter-base junction, can be achieved across the collector-base junction by a difference in extension of said junctions and that nevertheless a sufficiently large amplification factor is possible.

It has been found that, in spite of the fact that the collector-base junction has smaller dimensions than the emitter-base junction, a very useful amplification factor, for example a collector-base current amplification factor $\beta$ exceeding 10, is easily possible due to the high quality of present semiconductor materials.

The optic means are preferably means to supply, via the said one side of the semiconductor body, radiation to the vicinity of the emitter-base junction, in which the photo-current across the collector-base junction can be further reduced by a metal layer (metal electrode) which is connected to the collector zone and which, viewed on the one side of the semiconductor body, is present above at least the greater part of the collector zone.

Alternatively, a collector zone may advantageously be used which is constituted by a metal-containing layer which is provided on the base zone and forms a Schottky junction therewith. The metal-containing layer may screen the collector-base junction from radiation comming from the optic means and in this manner contribute to a very small photo-current across the collector-base junction.

A further embodiment of a semiconductor device according to the fifth aspect of the invention is characterized in that the transistor comprises a number of juxtaposed collector zones which are situated at one side of the semiconductor body. Several collectors present the possibility of obtaining in an advantageous manner electrically separated outputs which can be connected to separate inputs of subsequent transistors. Furthermore, by controlling the current consumption at one collector, the amplification factor $\beta$ for another collector can be controlled.

The extent of the emitter-base junction preferably is at least twice at large as that of a collector-base junction.

In order that the invention may be readily carried into effect, embodiments thereof will now be described in greater detail, by way of example, with reference to the accompanying diagrammatic drawings, in which

FIG. 6 is a sectional view of still another embodiment of a semiconductor device according to the invention, of which

Figure 11:
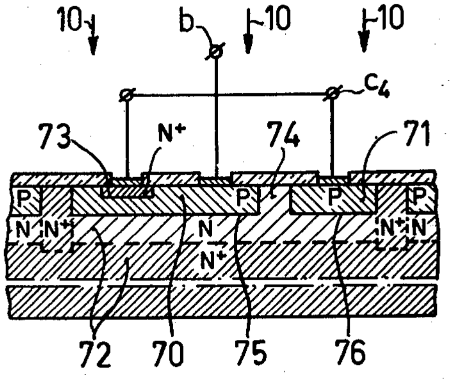

FIGS. 7, 8, 9 and 10 each are sectional views of a part of a variation,

FIG. 11 is a sectional view of an embodiment of a semiconductor device according to the invention, of which

Figure 6:
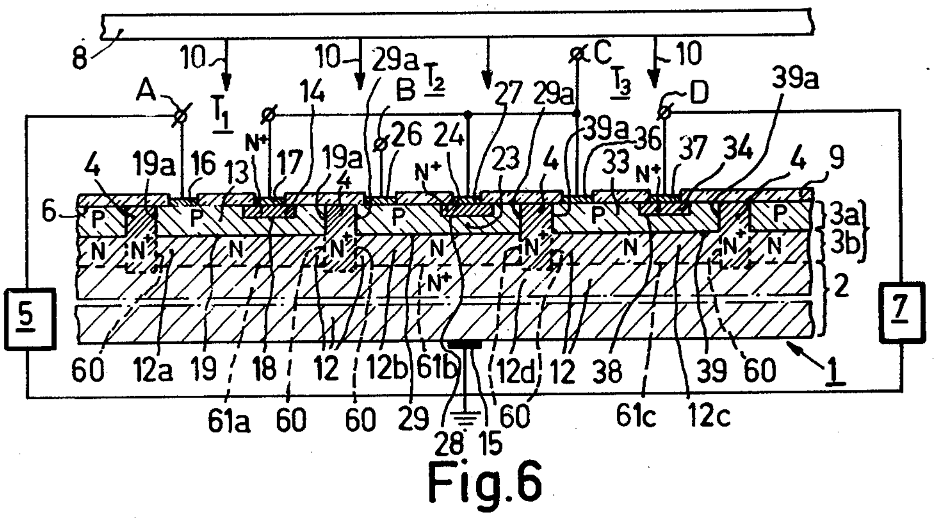
Figure 12:
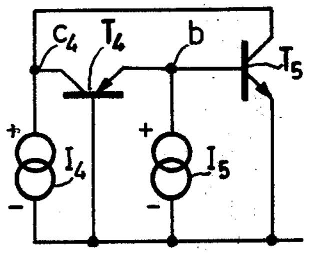
Figure 13:
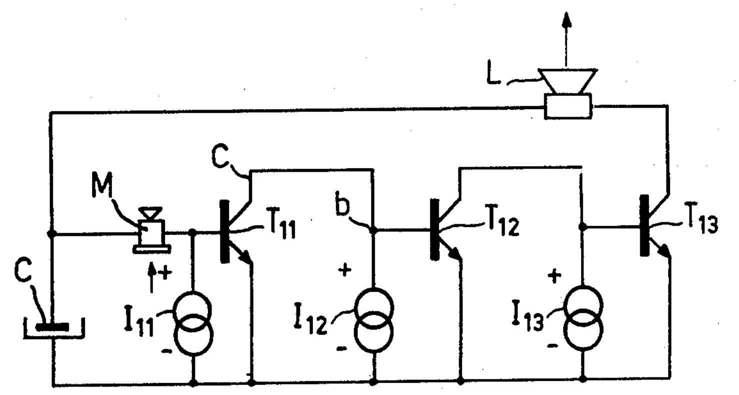
Figure 14:
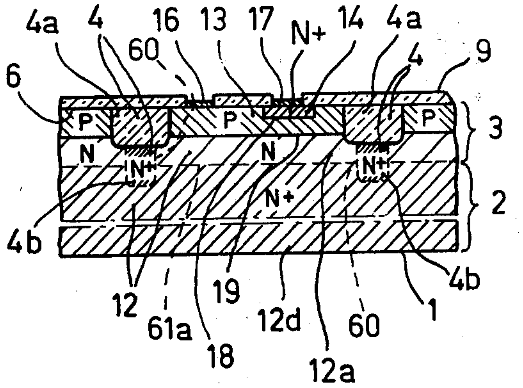

FIG. 12 shows the circuit diagram,

FIG. 13 shows a further embodiment of a circuit arrangement according to the invention,

FIG. 14 is a sectional view of a part of a further variation of the semiconductor device shown in FIG. 6, and

Figure 15:
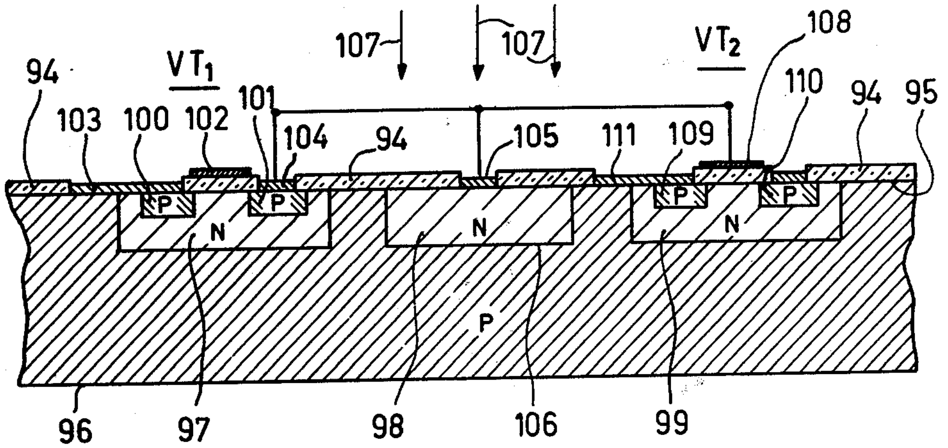

FIG. 15 shows the last embodiment of a circuit arrangement according to the invention in an integrated form.

Figure 1:
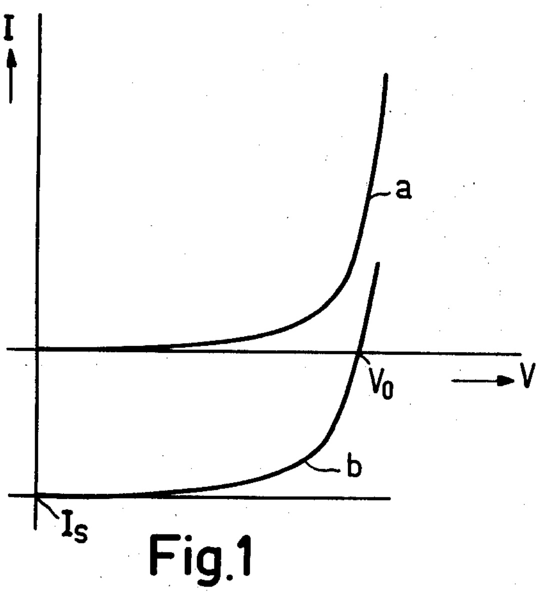
FIG. 1 shows the current-voltage characteristics of a p-n junction in unexposed and in exposed condition.

The curve *a* in FIG. 1 shows the current-voltage characteristic of a p-n junction in a semiconductor body in the unexposed condition and curve *b* in the exposed condition.

By exposing the surroundings of the p-n junction to radiation of suitable wavelength, hole-electron pairs are generated by absorption of radiation. As a result of the diffusion voltage across the p-n junction, the generated minority charge carriers cross said junction, that is to say, holes generated in the n-type region proceed to the p-type region and electrons generated in the p-type region proceed to the n-type region. In the case the p-n junction is short-circuited, all minority charge carriers which have crossed the p-n junction and have then become majority charge carriers are removed and do not influence the diffusion voltage. Externally they can be measured as a photo-current: shortcircuit current $I_s$. If no connection is made to the p-n junction, the generated holes collect in the p-region and the generated electrons in the n-region, as a result of which the p-n junction is polarised in the forward direction. The photo-voltage $V_o$ occurring in the forward direction across the p-n junction is equal to the forward voltage across the p-n junction which would be necessary without exposure to radiation to generate a current $I_s$ across the junction.

This phenomenon is effectively used in a particular manner in the circuit arrangements to be described hereinafter.

Figure 2:
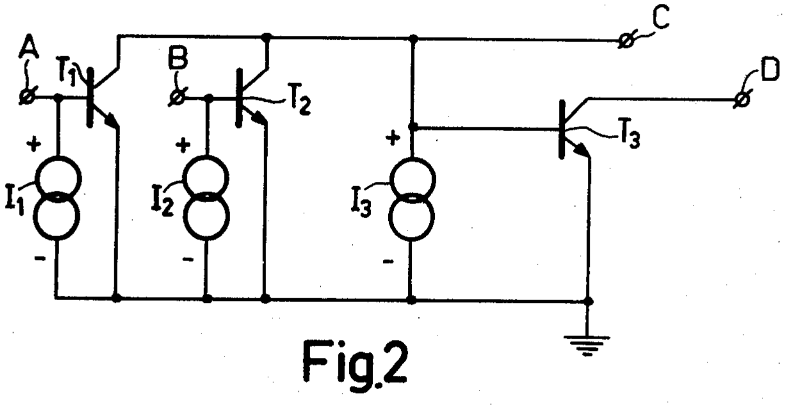
FIG. 2 shows an exemple of a circuit arrangement according to the invention.

FIG. 2 shows a circuit arrangement according to the first aspect of the invention, namely a NOR-gate consisting of two or more gate transistors $T_1$, $T_2$ . . . and succeeded by a subsequent transistor $T_3$. The inputs A, B . . . of the gate circuit are constituted by the base electrodes of the gate transistors $T_1$, $T_2$ . . . while their emitter-collector paths are shunted by the emitter-base path of the subsequent transistor $T_3$. Assuming the current sources $I_1$, $I_2$, $I_3$ shown with the indicated polarity to be present between the bases and emitters, the transistor $T_3$ will conduct current only (as a result of the current source $I_3$ operative in the forward direction) if neither the transistor $T_1$, nor the transistor $T_2$ is conducting, i.e. if both at the input A and at the input B earth potential, at least a potential below the internal base input threshold voltage of the transistors $T_1$ and $T_2$, respectively, prevails, so that the currents of the sources $I_1$ and $I_2$, respectively flow away to earth.

The said current sources are obtained by exposing the emitter-base junctions of the transistors $T_1$, $T_2$ . . . and $T_3$ to radiation.

Figure 3:
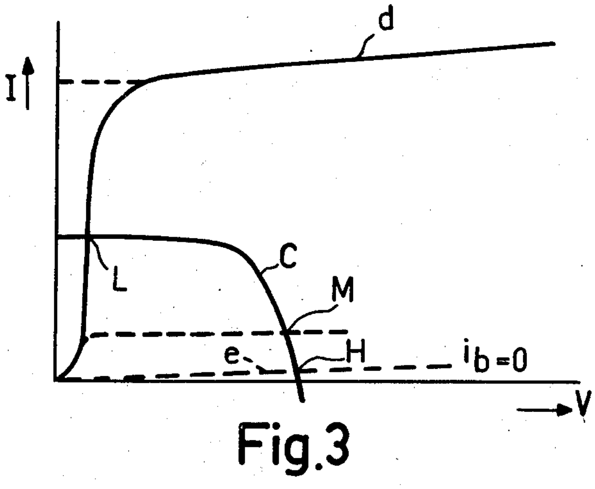
FIG. 3 shows a number of current-voltage characteristics of the transistors in the circuit arrangement shown in FIG. 2.

As already described with reference to FIG. 2, in the absence of signals at the points A and B (which are connected to the bases of the corresponding transistors $T_1$ and $T_2$, respectively), said transistors will be conducting as a result of the generated emitter-base photo-current and that so strongly that they divert the emitter-base photo-current of the transistor $T_3$ (as well as the possibly generated parasitic collector-base photo-currents), so that too little current remains for the base of the transistor $T_3$ to cause said transistor to conduct current. The emitter-base photo-current of the transistor $T_3$ as a function of its emitter-base voltage is shown in FIG. 3 by the curve *c*; the emitter-collector current of the transistors $T_1$ and $T_2$, respectively, as a function of its emitter-collector voltage is represented in said figure by the curve *d*. In the circumstances described, the circuit arrangement operates in the equilibrium condition L of which the associated voltage value remains below the internal base-emitter input threshold voltage of the transistor $T_3$. When the voltages both at the point A and the point B fall below said threshold voltage of the transistors $T_1$ and $T_2$, respectively, both the transistor $T_1$ and the transistor $T_2$ will be cut off, and an emitter-collector current as a function of the emitter-collector voltage of said transistors in accordance with curve *e* of FIG. 3 holds, at which the equilibrium condition H is reached. The transistor $T_3$ will then conduct current in abundance so that the voltage at its collector (point D) decreases substantially to earth potential.

According to the second aspect of the invention, the characteristic *b*, see FIG. 1, is used in a particular manner both for supplying the main current path of an electronic switch which is operated either in an on-condition or in an off-condition, for example a transistor, and for the formation of the load impedance for said electronic switch. As already described the exposed rectifying junction may form part of a subsequent transistor which is switched on or off in accordance with the condition of the first-mentioned transistor; however, the rectifying junction may also form part of the first-mentioned transistor itself which at the same time is set in its on-condition or off-condition by the voltage condition across the rectifying junctinn.

An example according to said second aspect of the invention is shown in FIG. 15. A p-type semiconductor body 96, the surface 95 of which is covered with an insulating layer 94, comprises the n-type islands 97, 98 and 99 adjoining the surface 95. A field effect transistor $VT_1$ having a p-type source zone 100 and a p-type drain zone 101 is provided in the island 97. The gate electrode 102 of the field effect transistor $VT_1$ is provided on the insulating layer 94 between the source and drain zones 100 and 101. The source zone 100 is connected, by means of the conductor 103, to the n-type island 97 and to the p-type part of the semiconductor body 96 surrounding said island. The drain zone 101 is connected to a contact 105 of the island 98 via a contact 104.

The island 98 constitutes the p-n junction 106 with the surrounding p-type part of the semiconductor body 96. By exposing the surroundings of said p-n junction 106 to radiation 107, the source zone 101 is supplied. The diode which is constituted by the island 98 and the surrounding p-type part of the body 96 serves as a load impedance of the field effect transistor $VT_1$.

The voltage at the contact 105 is supplied to the gate electrode 108 of a further field effect transistor $VT_2$ which is provided in the island 99 and comprises a p-type source zone 109 which is connected, via a conductor 111, to the island 99 and the surrounding p-type part of the body 96, and comprises a p-type drain zone 110. In this case an analogous switching effect is obtained as has been described with reference to FIG. 2 in relation to bipolar transistors.

The second aspect of the invention is also realized in the circuit arrangement shown in FIG. 2. Since the main current paths — i.e. the emitter-collector paths — of the transistors $T_1$ and $T_2$ are connected parallel to the semiconductor junction which is constituted by the base-emitter path of the transistor $T_3$, said semiconductor junction on the one hand ensures the supply current for the transistors $T_1$ and $T_2$ (denoted by the photo-current source $I_3$), and on the other hand the voltage vaiiation across said semiconductor junction, so between the base and the emitter of the transistor $T_3$, is used to control the transistor $T_3$ which serves as a further electronic switch.

In practice, the gate circuit shown in FIGS. 2 and 3, respectively, constitutes only a small component of a complete integrated circuit, in which as a rule a larger number than the two gate transistors $T_1$ and $T_2$ are arranged with their collector-emitter path between the point C and earth (fan-in), while also a larger number of transistors than only the transistor $T_3$ are connected with their base-emitter path between said points (fan-out). The points A and B, respectively, are then connected, for example, to the output C of preceding similar gate circuits, as also the output C of the circuit arrangement shown again leads to the inputs (in accordance with $T_3$) of subsequent similar gate circuits. It is of importance that the collector-base current amplification factor $\beta$ of the transistors used lies sufficiently above the number of fan-out transistors used so that the flat part of the curve $d$ in FIG. 3 remains above the operating point L.

A few embodiments of semiconductor devices according to the invention will now be described.

Figure 4:
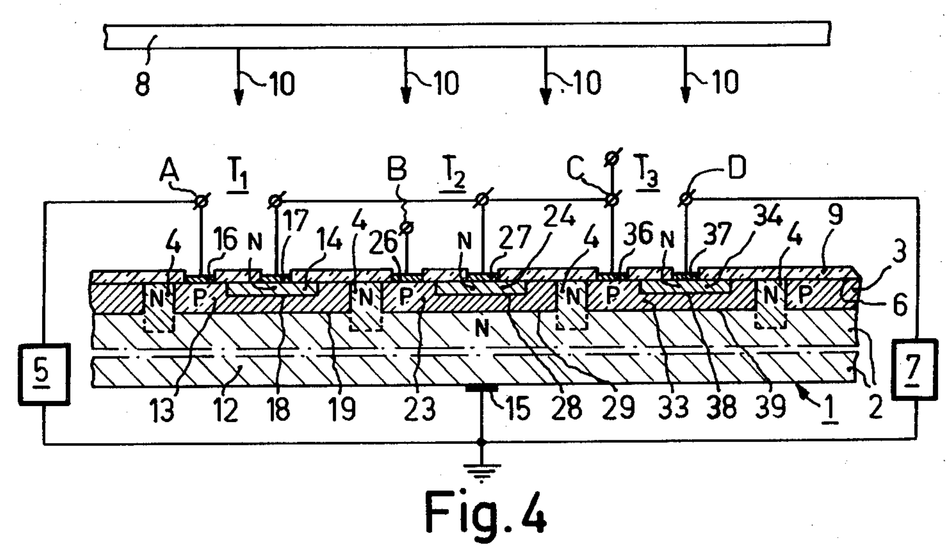
FIG. 4 is a sectional view of a semiconductor device according to the invention.

The semiconductor device shown in FIG. 4 which is suitable for use in a circuit arrangement shown in FIG. 2 comprises a semiconductor body 1 having a transistor $T_1$. Said transistor $T_1$ has an emitter zone 12, a base zone 13 and a collector zone 14 which are each provided with connection contacts 15, 16 and 17, respectively. Optic means 8 are present, for example a light source, to bias the emitter-base junction 19 of the transistor $T_1$ at least temporarily in the forward direction by exposure to radiation 10 which is, for example, visible light. Furthermore, a supply source is present, in the present embodiment constituted by the exposed emitter-base junction 39 of the transistor $T_3$, to bias the collector zone 14 of the transistor $T_1$ in the collecting condition. By means of a signal source 5, electric input signals are supplied to the transistor $T_1$ between the connection contacts 16 and 15 of the base zone 13 and the emitter zone 12. Electric output signals can be derived from the connection contact 17 of the collector zone 14 and in the present embodiment said signals are supplied to the transistor $T_3$.

According to the third aspect of the invention, the collector zone 14 adjoins the main surface 6 of the semiconductor body 1 in which, viewed on said main surface 6, the whole collector zone 14 is situated on a part of the base zone 13, the base zone adjoins the main surface 6 round about the collector zone 14, the base zone and the collector zone 14 together adjoin the main surface 6 only locally, and the emitter zone 12 extends below the whole base zone 13. The optic means 8 are means to supply optic radiation 10 to the surroundings of the emitter-base junction 19 of the transistor $T_1$ via the main surface 6, so that the photo-current generated by the optic means 8 across the emitter-base junction 19 in the case of an external short circuit across said junction 19 is larger than that across the collector-base junction 18 in the case of an external shortcircuit across said junction 18.

The semiconductor body 1 comprises an n-type semiconductor substrate 2 and an epitaxial p-type layer 3 which is provided on said substrate 2 and in which the p-type base zone 13 of the transistor $T_1$ is present. The substrate 2 adjoining the epitaxial layer 3 belongs to the n-type emitter zone of the transistor $T_1$. The collector zone 14 has n-type conductivity.

In addition to the transistor $T_1$, the semiconductor body 1 comprises another transistor $T_3$ having an n-type collector zone 34 which adjoins the main surface 6 of the semiconductor body 1. Viewed on the main surface 6, said collector zone 34 is situated on a part of the p-type base zone 33 of the transistor $T_3$, the base zone 33 adjoining the main surface 6 round about the collector zone 34. The emitter zone 12 which is common to the transistors $T_1$ and $T_3$ extends below the whole base zone 13 and 33 of the transistors $T_1$ and $T_3$.

The optic means 8 also supply radiation 10 to the surroundings of the emitter-base junction 39 of the transistor $T_3$ so as to bias said junction at least temporarily in the forward direction by optic radiation.

The collector zone 14 of one transistor $T_1$ is electrically connected to the base zone 33 of the other transistor $T_3$. Electric input signals are supplied to the base zone 13 of the transistor $T_1$ by means of the signal source 5 and electric output signals are derived from the collector zone 34 of the transistor $T_3$, which is denoted diagrammatically in FIG. 4 by the block 7.

The semiconductor body 1 which consists, for example, of silicon is covered with an insulating layer 9 provided on the main surface 6 and consisting, for example, of silicon oxide in which apertures are provided in which the contacts 16, 17, 36 and 37 for the base and collector zones of the transistors $T_1$ and $T_3$ are provided. For clarity, the electric connections are shown diagrammatically in FIG. 4. In practice they consist entirely or partly in the usual manner of conductive tracks provided on the insulating layer 9 and consisting, for example, of aluminium.

The semiconductor device shown in FIG. 4 comprises another transistor $T_2$ which is of the same type as the transistor $T_1$ and is operated in a manner similar to the transistor $T_1$. The transistor $T_2$ has an n-type emitter zone 12 which is common to the emitter zone of the transistors $T_1$ and $T_3$, a p-type base zone 23 and an n-type collector zone 24. The base and collector zones are provided with contacts 26 and 27. The collector zone 24 is connected electrically to the base zone 33 of the transistor $T_3$ and input signals are supplied to the base zone 23, the signal source destined for this purpose being not shown in FIG. 4 to avoid complexity of said figure.

The semiconductor device shown in FIG. 4 thus is suitable for use in the circuit arrangement shown in FIG. 2. The transistors $T_1$, $T_2$ and $T_3$ and the points A, B, C and D are shown both in FIG. 4 and in FIG. 2.

The common emitter zone 12 fully surrounds in the semiconductor body 1 the base zones 12, 23 and 33 and adjoins the main surface 6 in which, between the base zones 13, 23 and 33 of the transistors $T_1$, $T_2$ and $T_3$, surface zones 4 which are more highly doped than the base zones 13,23 and 33 and belong to the common emitter zone 12 are situated. Due to the more highly doped surface zones 4, parasitic transistors, for example, the parasitic transistor with the zones 23, 4 and 44, have no or only a small disturbing effect.

The semiconductor device shown in FIG. 4 constitutes a particularly simple and compact structure for the circuit arrangement shown in FIG. 2 in an integrated form, which is energized by means of radiation. This simple and compact structure with a common emitter zone for the transistors is possible by using inverse transistors, i.e. transistors in which at least the greater part of the emitter-base junction lies deeper in the semiconductor body than at least the greater part of the collector-base junction. As already explained above, this also has a favourable effect on the photo-current and/or photo-voltage to be generated across the emitter-base junction by means of radiation, for example, consisting of a visible light. For many circuit arrangments, for example for the circuit arrangement shown in FIG. 2, said advantages more than counterbalance the slightly smaller amplification factor of the inverse transistors.

The semiconductor device shown in FIG. 4 can be manufactured by means of methods conventionally used in semiconductor technology. Starting material is an n-type silicon substrate 2 on which a p-type epitaxial silicon layer 3 is provided. By diffusion of an impurity the n-type zones 4 are obtained in said layer 3, which zones 4 have a higher doping than the remaining p-type parts of the epitaxial layer 3, after which, likewise by diffusion of an impurity, the n-tye collector zones 14, 24 and 34 are provided. The insulating layer 9 of silicon oxide and the contacts 16, 17, 26, 37,36, 37 of the base and collector zones 13, 14, 23, 24, 33 and 34 and the contact 15 of the emitter zone 12 are also provided in a manner conventionally used in semiconductor technology.

By diffusion of an impurity the base zones 13, 23 and 33 may be provided with a more highly doped ($p^+$) surface layer so that the parts of the base zones 13, 23 and 33 adjoining the main surface 6 will show an increasing impurity concentration in a direction towards said main surface. As a result of this the surface recombination in the base zones is reduced, which favourably influences the amplification factor of the transistors $T_1$, $T_2$ and $T_3$. Moreover, due to the resulting drift field in the base zones, the free minority charge carriers generated in the base zones by radiation are driven to the emitter-base junctions.

Instead of the diffused n-type zones 4, insulating layers which are inset in the semiconductor body 1 and which extend from the main surface 6 in the body 1 and over a part of the thickness of said body, may be provided between the base zones 13, 23 and 33 of the transistors $T_1$, $T_2$ and $T_3$. These insulating layers can be obtained, for example, by local oxidation of the body 1, a silicon nitride layer being used as an oxidation mask. The zones 4 then consist of silicon oxide and extend throughout the thickness of the epitaxial layer 3.

Figure 5:
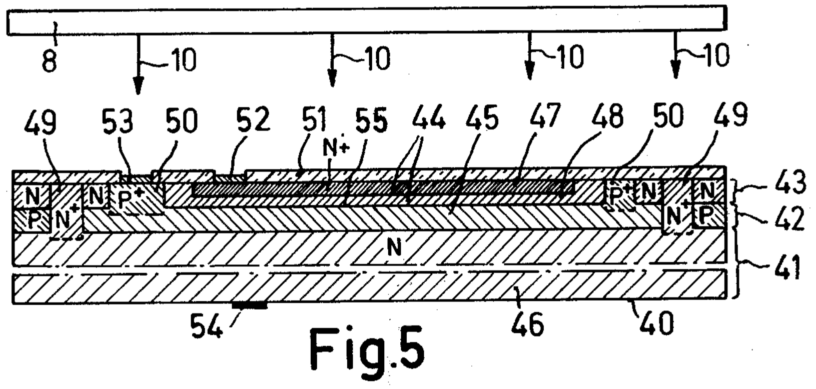
FIG. 5 is a sectional view of another embodiment of a semiconductor device according to the invention.

FIG. 5 shows a semiconductor device according to the fourth aspect of the invention which comprises a semiconductor body 40 having a transistor with an n-type emitter zone 44, a p-type base zone 45 and an n-type collector zone 46. Optic means 8, for example, in the form of an incandescent lamp, are present to bias the emitter-base junction 55 at least temporarily in the forward direction by optic radiation. Furthermore a supply source is present to bias the collector zone 46 in the collecting condition. This supply source is not shown in FIG. 5 to avoid complexity of said figure but it may be similar to that shown in FIG. 4 for the collector zone 14 of the transistor $T_1$.

According to the fourth aspect of the invention the n-type emitter zone 44 comprises two adjoining n-type subzones 47 and 48 of which one subzone 48 has a higher resistivity than the other subzone 47. The one subzone 48 is situated between the base zone 45 and the other subzone 47 and constitutes the emitter-base junction 55 with the p-type base zone.

The semiconductor device shown in FIG. 5 may be used in the circuit arrangement shown in FIG. 2.

Since the emitter zone 44 comprises a low-ohmic subzone 47 and a high-ohmic subzone 48, the life of the minority charge carriers in said part of the surroundings of the emitter-base junction 55 constituted by the subzone 48 is prolonged and hence the generation of a photo-current across said junction is favourably influenced. The emitter efficiency and hence the amplification factor of the transistor is good provided the high-ohmic subzone 48 be not extremely thick. For a good emitter efficiency, the thickness of said subzone must be smaller than a diffusion length of the minority charge carriers in said subzone. With the present-day high-quality semiconductor materials, for example silicon, the diffusion length is many tens of $\mu$m and the thickness of the subzone 48 below the subzone 47 preferably is between 0.1 and 50 $\mu$m.

The semiconductor device shown in FIG. 5 can be manufactured by means of conventional semiconductor methods. Starting material is an n-type silicon substrate 41 on which a p-type epitaxial silicon layer 42 is provided. An epitaxial n-type silicon layer 43 is provided on the layer 42. By diffusion of impurities, the diffused $p^+$-type zones 49 which extend throughout the thickness of the epitaxial layers 42 and 43, the $p^+$-type zones 50 which extend throughout the thickness of the epitaxial layer 43, ann the $n^+$-type subzone 47 of the emitter zone 44 which extends over a part of the thickness of the epitaxial layer 43 are then provided. The semiconductor body is covered with a passivating and insulating layer 51 of silicon oxide. Apertures are provided in said layer 51 so as to provide the emitter zone 44 and the base zone 45 to which the zones 50 belong with contacts 52 and 53, respectively. The collector zone 46 to which the zones 49 belong is provided with a contact 54.

The fourth aspect of the invention may advantageously be combined with the third aspect of the invention. When an emitter zone having to subzones is used in the semiconductor device shown in FIG. 4, the semiconductor device shown in FIG. 6 is obtained. In FIGS. 4 and 6, corresponding components are referred to by the same reference numerals.

The $n^+$-type collector zone 14 of the transistor $T_1$ shown in FIG. 6 adjoins the main surface 6 of the semiconductor body 1. Viewed on said main surface, the whole collector zone 14 is situated on a part of the p-type base zone 13, the base zone 13 adjoining the main surface 6 round about the collector 14. The base zone 13 is situated entirely on the one n-type subzone 11*a* of the emitter zone 12 and said one subzone 12*a* is situated entirely on the other $n^+$-type subzone 12*d* of the emitter zone 12. The n-type subzone 12a has a higher resistivity than the $n^+$-type subzone 12*d*. The one subzone 12*a* is bounded, in directions parallel to the main surface 6, by an $n^+$-type region 4 which surrounds the base zone 13 and extends from the main surface 6 in the semiconductor body 1 and which adjoins the part of the other $n^+$-type subzone 12*d* situated below the one subzone 12*a*. The $n^+$-region 4 constitutes, with the one n-type subzone 12*a*, an $n^+n$ junction 60 which hampers the penetration of minority charge carriers (holes) from the one subzone 12*a* into the region 4.

The $n^+n$ junction 61*a* between the one subzone 12*a* and the other subzone 12*d* also constitutes a hindrance for holes which want to penetrate the subzone 12*d* from the one subzone 12*a*. This means that during operation of the transistor $T_1$ holes which are injected from the p-type base zone 13 in the one n-type subzone 12*a* of the emitter zone 12 have a long stay in the one subzone 12*a*, which improves the emitter efficiency and the amplification factor of the transistor $T_1$.

The transistors $T_2$ and $T_3$ have a structure similar to that of the transistor $T_1$ and have n-type emitter subzones 12*b* and 12*c*, respectively, which constitute the $n^+n$ junctions 61*b* and 61*c*, respectively, with the $n^+$-type emitter subzone 12*d*. The transistors $T_1$, $T_2$ and $T_3$ have a common emitter zone 12.

Like the semiconductor device shown in FIG. 4, the semiconductor device shown in FIG. 6 comprises the circuit arrangement shown in FIG. 2 in an integrated form.

The semiconductor body 1 comprises an $n^+$-substrate 2 on which an epitaxial layer 3 is provided which adjoins the main surface 6 of the semiconductor body 1. In the epitaxial layer 3 are situated the base zones 13, 23 and 33 which adjoin the main surface 6 round about the collector zones 14, 24 and 34 and which extend only over part of the thickness of the epitaxial layer 3 and which are situated below the whole collector zones 14, 24 and 34, respectively. The parts of the epitaxial layer 3 situated below the base zones 13, 23 and 33 belong to the one subzones 12*a*, 12*b* and 12*c* of the common emitter zone 12. The substrate 2 adjoining the epitaxial layer 3 belongs to the other subzone 12*d* of the common emitter zone 12. The optic means 8 for energising the device, for example an incandescent lamp, supply radiation, via the main surface 6, to the surroundings of the emitter-base junctions 19, 29 and 39.

In the present embodiment, the base zones 13, 23 and 33 are bounded in directions parallel to the main surface 6, by the $n^+$-type regions 4, in which, only with the exception of the edge parts 19*a*, 29*a* and 39*a* of the emitter-base junctions 19, 29 and 39, said junctions are constituted by the one subzones 12*a*, 12*b* and 12*c* and the base zones 13, 23 and 33. As a result of this, the subzones 12*a*, 12*b* and 12*c* are as small as possible, which is favourable for the emitter efficiency.

In the present embodiment the $n^+$-type regions 4 extend throughout the thickness of the epitaxial layer 3, are of the same conductivity type as the common emitter zone 12, belong to the other $n^+$-subzone 12*d* of said emitter zone 12 and are more highly doped than the base zones 13, 23 and 33, as a result of which they can suppress parasitic transistor actions between said base zones.

The $n^+$-type regions 4 may be replaced by regions of an insulating material, for example silicon oxide, extending throughout the thickness of the epitaxial layer 3. When the semiconductor body 1 consists of silicon, said insulating regions of silicon oxide may be obtained, for example, by local oxidation of the silicon body while using an oxidation of silicon nitride.

The semiconductor device shown in FIG. 6 may be manufactured as follows.

Starting material is an $n^+$-type silicon substrate 2 having a resistivity of approximately 0.01 ohm.cm and a thickness of approximately 250 $\mu$m. First an n-type epitaxial layer 3*b* may be provided on which a p-type epitaxial layer 3*a* is then provided. In the present embodiments, however, first an n-type epitaxial silicon layer 3 is provided having a resistivity of approximately 0.2 ohm.cm and a thickness of 6 $\mu$m. By diffusion of boron, the p-type surface layer 3*a* is then provided in a thickness of 3 $\mu$m and a surface concentration of approximately $10^{18}$ boron atoms per ccm. By diffusion of phosphorus the $n^+$-type regions 4 are then provided which extend throughout the thickness of the epitaxial layer 3. Also by a diffusion of phosphorus are provided the collector zones 14, 24 and 34 in a thickness of 2.5 $\mu$m. The surface concentration of the zones 4, 14, 24 and 34 is approximately $10^{20}$ phosphorus atoms per ccm. The thickness of the n-type subzones 12*a*, 12*b* and 12*c* thus is approximately 3 $\mu$m. In a usual manner, an insulating layer 9 of silicon oxide is provided on the main surface is apertures of which the aluminum contacts 16, 17, 26, 27, 36 and 37 are provided which are connected to conductive aluminum tracks situated on the insulating layer 9 to form electric connections. These conductive connections are shown only diagrammatically in FIG. 6. The emitter zone 12 is provided with a contact 15 in a usual manner.

Viewed on the surface 6, the collector zones have an area of approximately 20 $\mu$m × 20 $\mu$m and the base zones 13, 23 and 33 of approximately 50 $\mu$m × 70 $\mu$m, while the width of the $n^+$-type zones 4 is approximately 10 $\mu$m.

Figure 7:
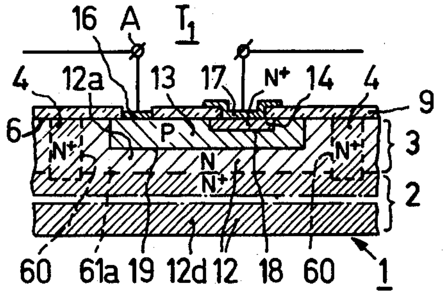

It is also possible to provide the base zones 13, 23 and 33 by local diffusion in the epitaxial layer 3, n-type parts of the epitaxial layer 3 being situated between the base zones and adjoining the main surface 6, in which parts the $n^+$-type regions 4 may then be provided. FIG. 7 shows this embodiment for the transistor $T_1$ and its surroundings. In this case the $n^+$-type regions 4 are located at some distance from the base-zones 13, 23 and 33 while the resulting configuration is slightly less compact. In this case also the $n^+$-type regions 4 may be replaced by regions of insulating material.

The current sources $I_1$, $I_2$ and $I_3$ in FIG. 2 are constituted by the exposed emitter-base junctions 19, 29 and 39 in FIG. 6. The incident radiation 10, however, impinges both on the surroundings of the collector-base junctions 18, 28 and 38 and the surroundings of the emitter-base junctions 19, 29 and 39 as a result of which current source which are operative between the base zones 13, 23 and 33 and the collector zones 14, 24 and 34 occur in addition to the current sources $I_1$, $I_2$ and $I_3$. The first-mentioned current sources constitute a slightly disturbing effect on the ready operation of the circuit arrangement shown in FIG. 2, the meaning of which, however, is negligible due to the configuration chosen as will become apparent hereinafter.

A semiconductor device shown in FIG. 6 comprising a semiconductor body 1 having a transistor $T_1$ with a collector zone which is present at one side (at the main surface 6) of the semiconductor body 1 and which constitute the collector-base junction 18 of the transistor, and with an emitter zone 12 which, viewed on the said side (on the main surface 6), is situated at least below the collector zone 14 and which constitutes the emitter-base junction 19 with the base zone 13, in which optic means 8 are present to bias the emitter-base junction 19 at least temporarily in the forward direction by optic radiation, and with a supply source (constituted by the exposed junction 99) to bias the collector zone 14 in the collecting condition, has according to the fifth aspect of the invention a collector-base junction 18, which, when viewed on the said one side (main surface 6) has a considerably smaller lateral extent than the emitter-base junction 19, as a result of which the photo-current across the emitter-base junction 19 generated by the optic means 8 in the case of an external shortcircuit across said junction is larger than that cross the collector-base junction 18 in the case of an external shortcircuit across said junction.

Since the optic means 8 supply radiation 10 via the said one side (the main surface 6) of the semiconductor body 1 to the surroundings of the emitter-base junction 19, a considerable part of the collector-base junction 18 is screened from the radiation 10 by the contact 17 which consists of an aluminium layer. As shown in FIG. 7, the aluminium layer 17 connected to the collector zone 14, viewed on the main surface 6, may even extend above the whole collector zone 14 and thus screen the collector-base junction 18 substantially entirely.

For the transistor $T_2$ and $T_3$ it also holds that the lateral extent of the collector-base junctions 18 and 38 is considerably smaller than that of the emitter-base junctions 29 and 39 and that the contacts 27 and 37 which consist of a metal layer of aluminium screen at least a considerable part of the collector-base junctions 28 and 38 from the radiation 10.

Figure 8:
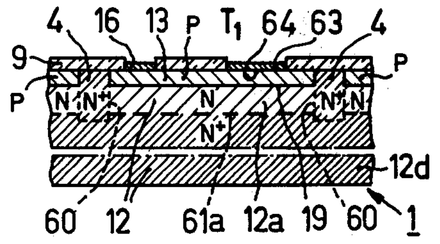

A further improvement can still be obtained by using, instead of collector zones comprising an $n^+$-type zone, collector zones which are constituted by a metal-containing layer which is provided on the base zones and form a Schottky-junction therewith. This is shown in FIG. 8 for the transistor $T_1$. The metal-containing layer 63 constitutes the Schottky-junction 74, that is to say the collector-base junction 64, with the base zone 13. A Schottky-junction is little photo-sensitive and has the additional advantage that the speed of the circuit is increased.

The collector zones 14, 24 and 34 in FIG. 6 are highly doped as a result of which free charge carriers generated in said zones by the radiation will recombine for a considerable part before they can contribute to the photo-current across the collector-base junctions 18, 28 and 38.

The base zones 13, 23 and 33 are diffused zones having an impurity concentration which decreases in directions toward the emitter-base junctions 19, 29 and 39, as a result of which said zones show a drift field and electrons generated in the base zones will move mainly not to the collector-base junctions but to the emitter-base junctions.

By suitable choice of the thicknesses and dopings of the various zones, further influence can be exerted on the generated photo-currents. For example, the thickness of the collector zones 14, 24 and 34 is smaller than the depth of penetration of at least a considerable part of the radiation 10 in the semiconductor body 1. Furthermore, the emitter-base junctions 19, 29 and 39 lie slightly deeper than the collector-base junctions 18,28 and 38 and the common emitter zone 12 comprises the high-ohmic subzones 12*a*, 12*b* and 12*c*, which favourably influences the radiation absorption in the surroundings of the emitter-base junctions.

Figure 9:
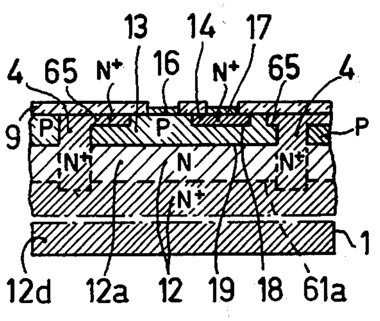

In addition, the extension of the emitter-base junction of the transistors can be increased by providing the emitter zone of a transistor with a surface zone-termed emitter rim zone situated beside the collector zone and separated by the base zone from the part of the emitter zone situated below the base zone and which adjoins a part of the emitter zone which adjoins the main surface and is situated beside the base zone. This is shown in FIG. 9 for the transistor $T_1$. The transistor $T_1$ has an emitter zone 12 which comprises the emitter rim zone 65 which adjoins the part 4 of the emitter zone which is situated beside the base zone 13 and adjoins the main surface 6.

The radiation 10 used must be adapted to the semiconductor material used in a manner which is usual for photo-sensitive semiconductor devices. In the present emmbodiment the radiation 10 must thus be capable of generating free charge carriers in silicon. The radiation 10 may consist, for example, of visible and/or infrared radiation and comprises preferably a considerable part having a wavelength in the neighbourhood of 800 $\mu$m. The radiation source 8 may be any source of radiation which emits radiation of the desirable wavelength, for example, an incandescent lamp or a discharge lamp. Day-light may also be used. In addition the radiation source may be a p-n recombination radiation source. This latter radiation source cannot only be combined with the semiconductor body 1 but may even be incorporated in the semiconductor body 1.

The optic means for supplying the radiation 10 may thus comprise a radiation source which is or is not combined with the semiconductor body 1 or is incorporated in the semiconductor body 1, or they may only consist of means which permit radiation to be supplied to the semiconductor body 1, for example, a radiation-transmitting window in an envelope of the semiconductor device, via which window day-light can be caused to impinge upon the semiconductor body 1.

The semiconductor body 1 may form part of a larger semiconductor body both in lateral directions, that is to say in directions parallel to the main surface 6, and in the direction of thickness, that is to say in a direction at right angles to the main surface 6.

From the embodiments described it has become obvious that considerable technological savings and advantages of an electric nature can be obtained by using the invention. As a rule, the use of four masks during the manufacturing process is sufficient, a particularly high packing density of the active elements is achieved, the transistors used have a common emitter so that mutual connection tracks become superfluous, the collectors on the contrary are automatically separated from each other, resistors may be omitted entirely, which means a very large space gain, the space between the regions 4, which separate the base zones, is entirely filled up by the active elements, buried layers become superfluous, wiring for supplying supply voltages may be omitted. A particular advantage during operation is that all the currents vary in the same manner with the intensity of the incident light so that the disturbance-sensitivety of the circuit arrangement is very small. Over irradiation by too large a light intensity is hardly to be feared (provided the temperature rise occurring as a result be not exorbitantly high), the voltages produced increase only by the logarithm of the incident radiation energy, so that the circuit arrangement automatically provides a certain limit of the said voltages.

Figure 10:
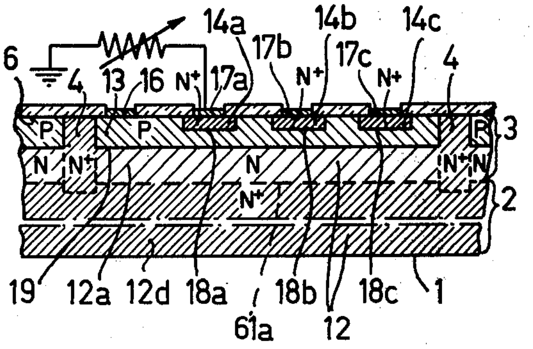

A transistor, for example of the semiconductor device shown in FIG. 6, may comprise a number of collector zones 14*a*, 14*b* and 14*c* present at the one side (at the main surface 6) of the semiconductor body 1, as is shown in FIG. 10 for such a transistor. The use of a number of collector zones provides the possibility of obtaining in a simple manner electrically separated outputs which can be connected to separated inputs of subsequent transistors. Furthermore, by controlling the collector current at one of the collector zones, the amplification factor $\beta$ for the other collector zones can be controlled. For example, if one of the collectors, for example 14$a$, is connected to a controllable resistor, for example the collector-emitter path of a controlled transistor, the collector-base current amplification factor $\beta$ for another collector, for example 14$b$, will vary with the said controllable resistance.

It has been found in practice that an amplification factor $\beta$ with a value 10 is possible without trouble for an inverse transistor according to the invention. This is sufficient for most of the purposes.

When a number of separated collector zones 14$a$, 14$b$, 14$c$ are provided, see FIG. 10, $\beta$ is surprisingly found to increase more than proportionally with the number of collector zones. For example, when one collector zone provides a $\beta$ or 10, in which the remaining collector zones remain at floating potential, a $\beta$ of approximately 25 is achieved when using two such zones, a $\beta$ of approximately 40 is achieved when using three such zones, and so on. This holds good when all the collector zones are equally large. This effect is presumably based on the fact that the collecting effect expands to a larger area than the actual collecting surface of the collector zones. The mutual distance of said collector zones is preferably of the order of magnitude of the base thickness below the collector zones.

The $n^+$-type regions 4 of the semiconductor device shown in FIG. 6 are inter alia provided in order to prevent a lateral transistor action between base zones of various transistors. However, circumstances may present themselves in which a lateral transistor action between two juxtaposed zones is desirable.

FIG. 11 shows an example of a semiconductor device in which a lateral transitor action occurs. The structure of said device differs from the structure of, for example, the transistor $T_1$ in FIG. 6 only in that the p-type base zone 13 in FIG. 6 consists of two parts 70 and 71 in FIG. 11, which parts are situated close beside each other. As a result of this the structure of FIG. 11 comprises, in addition to a transistor $T_5$ with the n-type emitter zone 72, the p-type base zone 70 and the $n^+$-type collector zone 73, a lateral transistor $T_4$ with the p-type emitter and collector zones 70 and 71 and the n-type base zone 74. The collector zones 73 and 71 are interconnected. The electric equivalent circuit diagram is shown in FIG. 12. The current source $I_5$ is obtained by exposing the emitter-base junction 75 of the transistor $T_5$ to radiation and the current source $I_4$ is obtained by exposing the collector-base junction 76 of the transistor $T_4$ to radiation.

Due to exposure, the photo-current source $I_5$ will cause the transistor $T_5$ to become conductive. The current of the photo-current source $I_4$ will hence mainly flow through the collector-emitter path of the transistor $T_5$. As a result of this the voltage at the collector electrode $c_4$ of the transistor $T_5$ will fall to below the voltage at the base electrode $b$ of the transistor $T_5$ as a result of which current starts flowing across the lateral p-n-p transistor $T_4$, which current is derived from the source $I_5$. Ultimately, an adjusting point M (FIG. 3) will be reached in which only a small fraction of the current of the source $I_5$ flows through the transistor $T_5$ as a base current, and that so little that said transistor operates in its linear operating range. When used as an electronic switch, such an adjustment has the advantage that not more storage of charge in the base zone takes place than is just necessary to operate the transistor in its strongly conductive condition. However, the device may also be used as a negatively fed back linear amplifier.

A simple other linear amplifier the equivalent circuit diagram of which is shown in FIG. 13 can also be realised by means of the structure of FIG. 6. The structure of the transistors $T_{11}$, $T_{12}$ and $T_{13}$ again correspond to that of the transistors $T_1$, $T_2$ and $T_3$ shown in FIG. 6. This time, however, the collector $C_T$ of the first transistor is connected to the base $b$ of the second transistor whose collector is connected to the base of the third transistor, while finally the collector of the third transistor is connected, via a direct current transmitting circuit comprising a loudspeaker or telephone L and a microphone M, to the base of the first transistor. The capacitor C serves to suppress alternating current negative feedback. Due to the direct current feedback coupling via the said direct current transmitting circuit, again only so much base current will become available for each of the transistors, as also described with reference to FIGS. 11 and 12, (the remainder of the current of the photo-current sources $I_{11}$, $I_{12}$ and $I_{13}$ flowing away via the collector-emitter circuit of the preceding transistor in the cascade), that said transistors are working in their linear operating range. In this manner an extremely simple amplifier, for example for hearing aids, is obtained which operates only so long as the semiconductor element is exposed to radiation. In order to obtain current sources $I_{11}$, $I_{12}$ and $I_{13}$ of suitable value it is advisable that the surface of the emitter-base junctions of the transistors $T_{12}$ and $T_{13}$ be small relative to that of the transistor $T_{11}$.

A simple method for the (possibly automatic) gain control can be obtained by using, for example, two collectors as described with reference to FIG. 10. When one of the said collectors is connected to earth via a controllable resistor (for example the internal resistance of a transistor), the signal current to another collector will dependent on said resistor so that said signal current can easily be controlled, if desirable automatically.

The circuit arrangement shown in FIG. 2 can be extended in a simple manner to a ring counter or a shift register. The simplest form of a ring counter is a bistable trigger which is obtained if the connection point D is connected to, for example, the connection point B. The transistors $T_2$ and $T_3$ in that case constitute a trigger of the Eccles Jordan type.

It will be obvious that the invention is not restricted to the embodiments described and that many variations are possible to those skilled in the art without departing from the scope of this invention. For example, an antireflex layer may be provided on the insulating layer 9 in FIGS. 4 and 6. In order to increase the switching speed, the base zones at least below the collector zones may show an increasing doping in the direction from the collector zones to the emitter zone. Such a doping may be obtained, for example, by ion implantation or by epitaxial growing, a varying quantity of impurities being supplied. Instead of starting from an $N^+$-type substrate 2 (see FIG. 6) on which an epitaxial lower-doped n-type layer 3 is provided, the starting material may also be an $n^+$-type substrate and this substrate may be provided by diffusing of impurities with a lower-doped n-type surface layer. In the embodiments described the conductivity types may also be interchanged. Conventional semiconductor materials and insulating materials other than silicon and silicon oxide may also be used, for example $A_{III}$-$B_V$ semiconductor materials and insulating layers of silicon nitride.

The n-type regions 4 in FIG. 6 may also be replaced partly, instead of fully, by regions of an insulating material as is shown in FIG. 14 for the transistor $T_1$ and its surroundings. The regions 4 are composed of the insulating sub regions *4a* and the $n^+$-type sub regions *4b*. The insulating sub regions *4a* are, for example, of silicon oxide and extend up to a slightly larger distance from the main surface 6 than the base zone 13. They may be obtained by local oxidation of the semiconductor body 1 while using an oxidation mask of, for example, silicon nitride. The $n^+$-type sub-regions *4b* can be obtained in a usual manner in the form of buried layers. Several semiconductor structures may also be combined, for example, in one semiconductor body, in which one structure shows opposite conductivity types relative to the other. Photo-currents generated in one structure may then supply the other structure, and conversely.

From a circuit-technical point of view, a number of refinements may be introduced, for example, the stabilisation of the incident quantity of light, for example by controlling the light source in accordance with the photo-voltage generated. By electric feedback coupling, for example, an oscillator can be obtained the frequency of which increases with the light intensity from which a control quantity for the light source can then be derived. In order to obtain an output signal of higher power, one or only a few output transistors (for example in emitter follower arrangement) may be used on an element having, for example, many tens or hundreds of transistors which are supplied only by the incident radiation, of which transistors the output connection should be connected via an output resistor to a supply voltage (further conductive tracks witin the integrated circuit for supplying said supply voltage then remain superfluous).

The described embodiments of semiconductor devices and semiconductor configurations in which energy conversion takes place, frequently will the aid of an emitter-base junction, may advantageously be used also in circuits other than those described and comprise a p-n junction to be biased in the forward direction.

What is claimed is:

1. A circuit arrangement having at least one transistor element which is energized by means of radiation, wherein said circuit arrangement comprises first and second transistors which are arranged in cascade, means for exposing the emitter-base junction of the second transistor to radiation and means for supplying at least part of the main current of the first transistor from current generated in said second transistor whereby said circuit can perform functions, including logic functions.

2. A circuit arrangement as claimed in claim 1, comprising a semiconductor body that comprises a coherent zone of one conductivity type, said first and second transistors comprising respective emitter regions comprising said coherent zone, said coherent zone adjoining separated base zones of the opposite conductivity type and said base zones comprising the base-collector junctions of the first and the second transistors.

3. A circuit arrangement as claimed in claim 2, wherein said semiconductor device comprises a further zone of said opposite conductivity type, said further zone and said emitter and base zones of one of said transistors comprising a lateral transistor.

4. A circuit arrangement as claimed in claim 3, wherein said further zone is electrically connected to the collector of said one transistor.

5. A circuit arrangement as claimed in claim 1, providing the direct current cascade of a number of transistors, wherein the last said transistor is connected to the first said transistor of the cascade via a direct current transmitting negative feedback circuit comprising the load and the base-emitter junction of said first transistor has a larger area than those of the subsequent transistors.

6. A circuit arrangement, comprising a semiconductor body that comprises a transistor device, said transistor device comprising an emitter zone, a base zone and a collector zone, connection contacts provided to respective ones of said zones, optic means for biasing the emitter-base junction of the transistor at least temporarily in the forward direction by optic irradiation and means for biasing the collector zone in the collecting condition, said collector zone adjoining a first main surface of the semiconductor body and being completely situated on a part of the base zone, the base zone adjoining said first main surface around the collector zone, the base zone and the collector zone together adjoining said first main surface only locally and the emitter zone extending below the whole base zone, the optic means comprising means to supply via said first main surface, optic radiation to the vicinity of the emitter-base junction of the transistor, electric input signals are supplied to the transistor between the connection contacts of the base and the emitter zones and electric output signals are derived from the connection contact of the collector zone, and the photo-current generated by the optic means across the emitter-base junction is larger in the case of the exernal short-circuit across the emitter-base junction than that across the collector-base junction in the case of an external short-circuit across said collector-base junction.

7. A semiconductor device as claimed in claim 6, wherein the part of the base zone adjoining said first main surface of the semiconductor body shows an increasing impurity concentration in a direction towards said first main surface.

8. A semiconductor device as claimed in claim 7, wherein said semiconductor body comprises a semiconductor substrate and an epitaxial layer disposed on said substrate, said epitaxial layer comprising base zone of the transistor, the emitter zone comprising at least the part of the substrate adjoining the epitaxial layer.

9. A semiconductor device as claimed in claim 6, wherein said emitter zone in the semiconductor body fully surrounds the base zone and adjoins said first main surface of the semiconductor body.

10. A semiconductor device as claimed in claim 9, wherein the emitter zone comprises a surface region that is situated beside the collector zone and that is separated by the base zone from the part of the emitter zone present below the base zone and adjoins a part of the emitter zone adjoining the first main surface and being situated beside the base zone.

11. A semiconductor device as claimed in claim 6, wherein said semiconductor body comprises a second transistor comprising a collector zone which adjoins the main surface of the semiconductor body and is situated on a part of the base zone of said second transistor, said base zone adjoining the main surface around the collector zone, said second transistor further comprising an emitter zone which is common to said second transistor and said first transistor, said emitter zone extending below the whole base zones of both said first and second transistors.

12. A semiconductor device as claimed in claim 11, wherein said optic means comprise means for irradiating the vicinity of the emitter-base junction of said second transistor so as to bias said junction at least temporarily in the forward direction.

13. A semiconductor device as claimed in claim 12, wherein said collector zone of said first transistor is electrically connected to the base zone of said second transistor, whereby electric input signals are supplied to the base zone of said first transistor and electric output signals are derived from the collector zone of said second transistor.

14. A semiconductor device as claimed in claim 11, wherein said common emitter zone comprises a surface region which is more highly doped than the base zone and is situated between the base zones of the first and second transistors.

15. A semiconductor device as claimed in claim 8, further comprising an insulating layer which is inset in the semiconductor body and extends from the first main surface of said semiconductor body over part of the thickness of said body, said insulating layer being situated between the base zones of the first and second transistors.

16. A circuit arrangement, comprising a semiconductor device comprising a semiconductor body, said body comprising a transistor including an emitter zone, a base zone and a collector zone, optic means for biasing the emitter-base junction of the transistor at least temporarily in the forward direction by optic irradiation and a supply source for biasing the collector zone in the collecting condition, wherein said emitter zone comprises two adjoining subzones of one conductivity type, a first zone of said subzones having a higher resistivity than the other subzone and being situated between the base zone and the other subzone, said base zone adjoining said first subzone and having an opposite conductivity type as to said first subzone and forming therewith at least a major part of the emitter-base junction.

17. A semiconductor device as claimed in claim 16, wherein said collector zone adjoins a main surface of the semiconductor body and the whole collector zone is situated on a part of the base zone, the base zone adjoining the main surface around the collector zone, the base zone being situated entirely on the one subzone of the emitter zone, said one subzone being situated on the other subzone of the emitter zone, and the one subzone in directions parallel to the main surface, being bounded by a region which surrounds the base zone, extends from the main surface in the semiconductor body, adjoins the part of the other subzone situated below the one subzone, and constitutes, with the one subzone, a junction, whereby said junction impedes the penetration of minority charge carriers from the one subzone into the region.

18. A semiconductor device as claimed in claim 16, wherein the semiconductor body comprises a semiconductor substrate having an epitaxial layer disposed thereon and adjoining a main surface of the semiconductor body in which epitaxial layer the base zone is present as a zone which adjoins the main surface around the collector zone and which extends only over part of the thickness of the epitaxial layer and is situated below the whole collector zone which adjoins the main surface, at least the part of the epitaxial layer situated below the base zone belonging to the one subzone of the emitter zone and at least the part of the substrate adjoining the epitaxial layer belonging to the other subzone of the emitter zone, the optic means comprising means to supply radiation to the vicinity of the emitter-base junction via the main surface.

19. A circuit arrangement comprising a circuit element which is operated in one of an on-condition and an off-condition and serves as an electronic switch, wherein said circuit arrangement comprises a rectifying junction disposed parallel to the main current path of the switch and connection means between said junction and said circuit element for supplying the main current for said switch said junction being exposed to radiation and being operable near one of the short-circuit current value and the zero current value of its current-voltage characteristic generated by said radiation depending on whether said switch is in one of said on-condition and off-condition, said circuit arrangement further comprising a further circuit element serving as an electronic switch and electrical connection means between said further circuit element and said junction, whereby the voltage thus generated across said rectifying junction is supplied for control purposes to said further circuit element.

20. A circuit arrangement as claimed in claim 19, wherein said circuit element comprising said electronic switch comprises said rectifying junction.

21. A circuit arrangement as claimed in claim 20, comprising a bipolar transistor serving as said further electronic switch, said bipolar transistor comprising an emitter-base junction that is said rectifying junction.

22. A semiconductor device comprising a semiconductor body comprising a transistor that includes a collector zone present at one side of the semiconductor body and constituting a collector-base junction with the base zone of the transistor and further includes an emitter zone, which viewed on the said side of the semiconductor body, is situated at least below the collector zone and which constitutes the emitter-base junction with the base zone, in which optic means are present to bias the emitter-base junction at least temporarily in the forward direction by optic irradiation and a supply source to the bias collector zone in the collecting condition, wherein viewed on the said one side of the semiconductor body, the collector-base junction has a considerably smaller lateral extent than the emitter-base junction, whereby the photo-current generated by the optic means across the emitter-base junction is larger in the case of an external short-circuit across said emitter-base junction than that across the collector-base junction in the case of an external short-circuit across said junction.

23. A semiconductor device as claimed in claim 22, wherein said optic means comprise means to supply radiation to the vicinity of the emitter-base junction via the said one side of the semiconductor body.

24. A semiconductor device as claimed in claim 22, wherein said collector zone comprises a metal-containing layer which is provided on the base zone and which forms a Schotty junction with the base zone.

* * * * *